United States Patent
Omelchenko et al.

(10) Patent No.: US 12,191,415 B2
(45) Date of Patent: Jan. 7, 2025

(54) MULTI-JUNCTION PHOTOVOLTAIC CELL HAVING WIDE BANDGAP OXIDE CONDUCTOR BETWEEN SUBCELLS AND METHOD OF MAKING SAME

(71) Applicant: California Institute of Technology, Pasadena, CA (US)

(72) Inventors: Stefan Omelchenko, Los Angeles, CA (US); Sisir Yalamanchili, Pasadena, CA (US); Nathan S Lewis, La Canada Flintridge, CA (US)

(73) Assignee: California Institute of Technology, Pasadena, CA (US)

( * ) Notice: Subject to any disclaimer, the term of this patent is extended or adjusted under 35 U.S.C. 154(b) by 279 days.

(21) Appl. No.: 16/396,495

(22) Filed: Apr. 26, 2019

(65) Prior Publication Data
US 2019/0334048 A1   Oct. 31, 2019

Related U.S. Application Data
(60) Provisional application No. 62/662,852, filed on Apr. 26, 2018.

(51) Int. Cl.
*H01L 31/0725* (2012.01)
*H01L 31/0216* (2014.01)
(Continued)

(52) U.S. Cl.
CPC .... *H01L 31/0725* (2013.01); *H01L 31/02168* (2013.01); *H01L 31/0288* (2013.01); *H01L 31/1864* (2013.01)

(58) Field of Classification Search
CPC .................. H01L 31/00–078; Y02E 10/50–60
(Continued)

(56) References Cited

U.S. PATENT DOCUMENTS

| | | | |
|---|---|---|---|
| 9,653,696 B2 | 5/2017 | Chaudhari | |
| 2010/0102450 A1* | 4/2010 | Narayan | C23C 14/0021 257/763 |

(Continued)

FOREIGN PATENT DOCUMENTS

CN    105609640    * 5/2016

OTHER PUBLICATIONS

Copenheaver, Blaine R., International Search Report and Written Opinion, PCT/US2019/029483, International Searching Authority, U.S. Patent and Trademark Office, Jul. 10, 2019.
(Continued)

*Primary Examiner* — Kourtney R S Carlson
(74) *Attorney, Agent, or Firm* — Gavrilovich, Dodd & Lindsey LLP (57) ABSTRACT

Increasing the power conversion efficiency of silicon (Si) photovoltaics is a key enabler for continued reductions in the cost of solar electricity. Disclosed herein is a multi-junction photovoltaic cell that does not utilize a conventional interconnection layer and instead places a wide bandgap oxide conductor, for example, a metal oxide such as $TiO_2$, between a top light absorption layer having a relatively large bandgap and a bottom light absorption layer having a relatively small bandgap. The advantageous omission of a conventional interconnection layer between the two subcells is enabled by low contact resistivity between the top and bottom light absorbing layers provided by the wide bandgap oxide conductor. The absence of the conventional interconnect between the subcells significantly reduces both optical losses and processing steps. The disclosed photovoltaic cell may thus enable low-cost, high-efficiency multi-junction devices through less complex manufacturing processes and lower material costs.

10 Claims, 9 Drawing Sheets

(51) Int. Cl.
*H01L 31/0288* (2006.01)
*H01L 31/18* (2006.01)

(58) Field of Classification Search
USPC .................................................. 136/243–265
See application file for complete search history.

(56) References Cited

U.S. PATENT DOCUMENTS

| | | | | |
|---|---|---|---|---|
| 2013/0104971 | A1* | 5/2013 | Wang | B32B 3/30 |
| | | | | 136/256 |
| 2013/0327401 | A1 | 12/2013 | Lin et al. | |
| 2014/0261669 | A1* | 9/2014 | Myers | H01L 31/0749 |
| | | | | 136/256 |
| 2015/0144196 | A1 | 5/2015 | Irwin et al. | |
| 2015/0249170 | A1* | 9/2015 | Snaith | H01L 31/035272 |
| | | | | 136/256 |
| 2016/0163904 | A1* | 6/2016 | Mailoa | H01L 31/0725 |
| | | | | 136/255 |
| 2016/0329159 | A1* | 11/2016 | Chaudhari | H01L 31/028 |
| 2017/0229518 | A1 | 8/2017 | Uddin | |
| 2018/0341090 | A1* | 11/2018 | Devlin | H01L 31/02 |
| 2019/0024246 | A1* | 1/2019 | Yang | C25B 11/02 |

OTHER PUBLICATIONS

Nickitas-Etienne, Athina, International Preliminary Report on Patentability and Written Opinion, PCT/US2019/029483, The International Bureau of WIPO, Nov. 5, 2020.

* cited by examiner

Table S1

| Scan rate | Scan direction | $V_{oc}$ (mV) | $J_{sc}$ (mAcm$^{-2}$) | FF | PCE (%) |
|---|---|---|---|---|---|
| 0.1 V/s | RS | 1703 | 17.2 | 0.792 | 23.2 |
|  | FS | 1698 | 17.1 | 0.789 | 22.9 |
| 0.01 V/s | RS | 1704 | 17.2 | 0.782 | 22.9 |
|  | FS | 1697 | 17.1 | 0.779 | 22.6 |

Table S2

| Field [G] | Resistivity [ohm cm] | Hall Coefficient [cm$^3$/C] | Type | Carrier Density [1/cm$^3$] | Hall Mobility [cm$^2$/(VS)] |
|---|---|---|---|---|---|
| $1.0000*10^3$ | $1.5740*10^2$ | $-1.6028*10^1$ | n | $3.8947*10^{17}$ | $1.0449*10^{-1}$ |
| $3.0000*10^3$ | $1.5720*10^2$ | $-1.5976*10^1$ | n | $3.9071*10^{17}$ | $1.0416*10^{-1}$ |
| $5.0001*10^3$ | $1.5678*10^2$ | $-1.9460*10^1$ | n | $3.2078*10^{17}$ | $1.2686*10^{-1}$ |

Table S3

| Field [G] | Resistivity [ohm cm] | Hall Coefficient [cm$^3$/C] | Type | Carrier Density [1/cm$^3$] | Hall Mobility [cm$^2$/(VS)] |
|---|---|---|---|---|---|
| $1.0000*10^3$ | $8.4670*10^{-1}$ | $-8.2446*10^{-1}$ | n | $7.5713*10^{18}$ | $9.8962*10^{-1}$ |
| $3.0000*10^3$ | $8.4615*10^{-1}$ | $-7.8738*10^{-1}$ | n | $7.9278*10^{18}$ | $9.4511*10^{-1}$ |
| $5.0001*10^3$ | $8.4497*10^{-1}$ | $-7.8614*10^{-1}$ | n | $7.9403*10^{18}$ | $9.3362*10^{-1}$ |

Figure 13

MULTI-JUNCTION PHOTOVOLTAIC CELL HAVING WIDE BANDGAP OXIDE CONDUCTOR BETWEEN SUBCELLS AND METHOD OF MAKING SAME

CROSS REFERENCE TO RELATED APPLICATIONS

This application claims the benefit of U.S. Provisional Patent Application Ser. No. 62/662,852, filed on Apr. 26, 2018, which is incorporated by reference herein in its entirety.

STATEMENT REGARDING FEDERALLY SPONSORED RESEARCH

This invention was made with government support under Grant No. DE-SC0004993 awarded by the US Department of Energy. The government has certain rights in the invention.

TECHNICAL FIELD

The present disclosure generally relates to photovoltaic cells, and more particularly, to multi-junction photovoltaic cells.

BACKGROUND

Silicon (Si) photovoltaic modules include one or more Si photovoltaic cells. The price of Si-based photovoltaic modules has dropped nearly exponentially over the past four decades, with the balance of systems costs now accounting for about 70% of a fully installed solar-electricity system. Further reductions in the cost of Si-based photovoltaic modules can thus most readily be obtained by increasing the module efficiency and thereby reducing the area-related balance of systems costs.

The current laboratory record power-conversion efficiency ($\eta$) for single-junction Si solar cells is 26.6%, closely approaching their theoretical limit of 29.4%.

A multi-junction cell design, such as a tandem cell, is one of the most practical approaches to obtain higher module efficiencies. A tandem photovoltaic cell typically includes a photovoltaic cell stacked on top of another. Other multi-junction cell designs may include more than two subcells. Each subcell may be optimized to a specific section of the spectrum. Efficiencies exceeding the single junction Shockley-Queisser limit of 32% under one-sun illumination have been obtained by combining III-V top subcells with a Si bottom subcell. However, a number of obstacles impede the commercial viability of multi-junction cell design, including the high materials and fabrication costs of III-V semiconductors.

Design approaches for creating multi-junction cells primarily involve two-terminal (2-T) or four-terminal (4-T) configurations. The two-terminal configuration allows for monolithic fabrication and obviates the need for additional front and rear electrodes.

The 2-T approach conventionally includes an interconnection layer between subcells that effectively facilitates, with reduced electrical and optical losses, the flow of photogenerated carriers from one subcell to the other and thence to the external circuit. In known constructions, tunnel junctions consisting of a homojunction between two heavily doped p+ and n+ regions have been used to provide the interconnection layer. Specifically, the first demonstration of a 2-T perovskite/Si tandem device used a heavily doped n-type amorphous Si (a-Si) layer to form a tunnel junction on top of a crystalline p$^+$-Si emitter in the Si homojunction bottom cell, resulting in $\eta$=13.7%. Improved light management, combined with advances in perovskite photovoltaics, has yielded $\eta$=22.7% by use of a heavily-doped n-type a-Si tunneling layer on a Si heterojunction (SHJ) bottom cell. Drawbacks of tunnel junction designs are that they require high-temperature processing, often in excess of 800° C., for the thermal diffusion of dopants and/or recrystallization, and often involve toxic gases for doping.

As an alternative to tunnel junction based interconnection layers, the subcell interconnection in some known high-efficiency 2-T perovskite/Si tandem devices has utilized a recombination layer formed with a transparent conductive oxide (TCO), such as indium-doped tin oxide (ITO) or indium-doped zinc oxide (IZO). The present record efficiency of 23.6% for perovskite-Si tandems was accordingly obtained by incorporating an ITO intermediate layer to connect a SHJ bottom cell to a perovskite top cell. Impediments to further efficiency improvements in such TCO-containing interconnection systems include substantial parasitic absorption due to free-carrier absorption at long wavelengths, suboptimal reflectance due to a mismatch between the refractive indexes of the TCO and Si, and the prevalence of shunt paths through the top cell, caused by surface roughness.

Accordingly, there is a need for improved multi-junction photovoltaic cells that offer lower material and manufacturing costs, and also overcome the limitations associated with known techniques of interconnecting subcells within a multi-junction cell.

SUMMARY

Disclosed herein are one or more examples of improved multi-junction photovoltaic cells and fabrication methods that do not utilize a conventional interconnection layer and instead place a wide bandgap oxide conductor between a top light absorption layer having a relatively large bandgap and a bottom light absorption layer having a relatively small bandgap.

In accordance with an exemplary embodiment, a multi-junction cell may include a perovskite top subcell (with the perovskite material as the top light absorption layer) in direct contact with a semiconductor bottom subcell (with the semiconductor as the bottom light absorption layer), such as a silicon (Si) homojunction bottom cell. Due to their large bandgap tunability, low materials cost, and simple processing requirements, inorganic-organic metal-halide perovskite materials are attractive candidates for the top cell in a tandem structure with Si. Engineered perovskites have also yielded substantial improvements in cell stability while yielding higher efficiencies. A wide bandgap conductor acting as a hole conductor, such as a metal oxide layer, for example, a titanium dioxide ($TiO_2$) layer, is positioned between the top and bottom subcell light absorption materials. The bottom subcell may include a semiconductor, e.g., a silicon substrate, contacting the wide bandgap conductor layer.

In accordance with another exemplary embodiment, a multi-junction photovoltaic cell may be a two-terminal tandem photovoltaic cell that includes a perovskite subcell having a titanium dioxide layer. The cell further includes a crystalline silicon homojunction subcell having a crystalline p-type emitter contacting the titanium dioxide layer.

An exemplary process of making a multi-junction photovoltaic cell is also disclosed. The method includes doping a silicon substrate to form a p-type emitter region on the silicon substrate. A titanium precursor is deposited on the p-type emitter region by atomic layer deposition (ALD) to form an ALD-TiO2 layer. A mesoporous TiO2 layer is deposited on the ALD-TiO2 layer, and the partially completed cell with the mesoporous TiO2 layer and the ALD-TiO2 layer are annealed for a period time at a suitable temperature. The period may be about 20 minutes and the temperature about 400° C. Next, a perovskite layer is deposited on the annealed mesoporous $TiO_2$ layer. A spiro-OMeTAD film is then deposited on the perovskite layer, and a MoOx layer is deposited on the spiro-OMeTAD film. A transparent conductor layer is fabricated on the MoOx layer, and one or more metal fingers are deposited on the transparent conductor layer.

The foregoing summary does not define the limits of the appended claims. Other aspects, embodiments, features, and advantages will be or will become apparent to one with skill in the art upon examination of the following figures and detailed description. It is intended that all such additional features, embodiments, aspects, and advantages be included within this description and be protected by the accompanying claims.

BRIEF DESCRIPTION OF THE FIGURES

It is to be understood that the drawings are solely for purpose of illustration and do not define the limits of the appended claims. Furthermore, the components in the figures are not necessarily to scale. In the figures, like reference numerals designate corresponding parts throughout the different views.

DETAILED DESCRIPTION

The following detailed description, which references to and incorporates the drawings, describes and illustrates one or more examples of a two-terminal tandem photovoltaic cell and example methods of fabricating the same. These examples, offered not to limit but only to exemplify and teach embodiments of inventive multi-junction photovoltaic cells, are shown and described in sufficient detail to enable those skilled in the art to practice what is claimed. Thus, where appropriate to avoid obscuring the invention, the description may omit certain information known to those of skill in the art. The disclosures herein are examples that should not be read to unduly limit the scope of any patent claims that may eventually be granted based on this application.

The word "exemplary" is used throughout this application to mean "serving as an example, instance, or illustration." Any system, method, device, technique, feature or the like described herein as "exemplary" is not necessarily to be construed as preferred or advantageous over other features.

As used in this specification and the appended claims, the singular forms "a," "an," and "the" include plural referents unless the content clearly dictates otherwise.

Although any methods and materials similar or equivalent to those described herein can be used in the practice or testing of the invention(s), specific examples of appropriate materials and methods are described herein.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

By "about" is meant a quantity, level, value, number, frequency, percentage, dimension, size, amount, weight or length that may vary by as much as 30, 25, 20, 25, 10, 9, 8, 7, 6, 5, 4, 3, 2 or 1% to a reference quantity, level, value, number, frequency, percentage, dimension, size, amount, weight or length. With respect to ranges of values, the claims may, some instances, encompass each intervening value between the upper and lower limits of the range to at least a tenth of the lower limit's unit, unless the context clearly indicates otherwise. Further, the claims may, in some instances, encompass any other intervening values.

Figure 1:
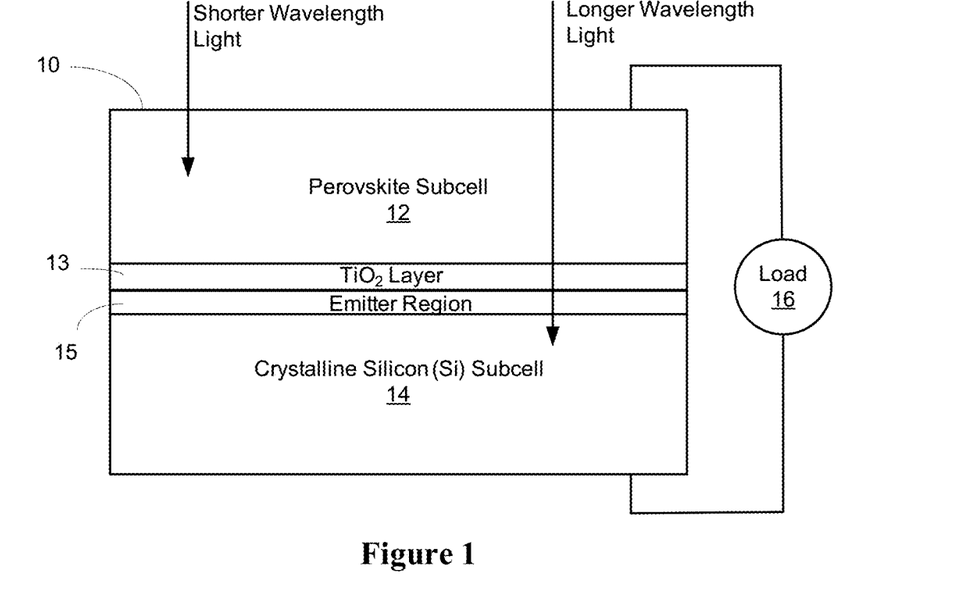
FIG. 1 is a schematic illustration of an exemplary multi-junction photovoltaic cell.

FIG. 1 is a schematic illustration of an exemplary multi-junction photovoltaic cell 10. The cell 10 is a two terminal (2-T) construction, with electrical terminals on a top subcell 12 and a bottom subcell for carrying current to a load 16.

The top subcell 12 may include a light absorption layer having a relatively large bandgap, for example, a layer of that includes, consists of, or consists essentially of perovskite material. Other suitable materials may be used for the top light absorption layer, for example, other organic materials, such as those used in solar cell applications, polymer dots, a polyacetylene polymer, hydrogenated amorphous silicon, carbon balls, any combination of the foregoing, or the like. The relatively large bandgap of the top light absorption layer may be in the range of about 1.5 eV-3 eV.

The bottom subcell 14 may include a light absorption layer having a relatively small bandgap, for example, a crystalline silicon (c-Si) material, or Gallium arsenide, cadmium telluride, bismuth vanadate, or other semiconducting light absorber with a suitable band gap to act as a long wavelength light absorber in a tandem structure, which may be used as a substrate for the cell 10. Other suitable materials may be used for the bottom subcell 14. The relatively small bandgap of the bottom light absorption layer may be in the range of about 0.5 eV-1.5 eV.

A wide bandgap oxide conductor layer, such as an oxide layer 13 that includes, consists of, or consists essentially of oxygen and one or more elements, e.g., titanium (e.g., a titania ($TiO_2$) layer) is included in the top subcell 12. The oxide conductor layer 13 may also include other large bandgap oxides that facilitate hole tunneling by virtue of defect band conduction, including, for example, $SnO_2$, $SrTiO_3$, any suitable combination these metal oxides (including $TiO_2$), and the like. The wide or large bandgap of the oxide conductor may be in the range of about 3 eV-5 eV. The properties of the oxide may include that it has an absorption of about 20% or less of light having energies between 0.5 eV and 3.0 eV, and it may have a resistance between the absorption layers of the tandem cell of less than 1000 ohms (or conductance of the oxide film greater than 0.001 mhos), e.g., producing a voltage loss of less than 1 V in certain embodiments of the cell, and less than 0.1 V in some embodiments. For example, in some embodiments of the cell, the oxide conductor film between the absorption layers may have a conductivity of greater than about 0.01 mho/cm$^2$ and in some instances, greater than about 0.1 mho/cm$^2$.

Included in the bottom subcell 14 is an emitter region 15 of the Si substrate that contacts the titania layer 13 of the top subcell 12. The conductive oxide layer 13, e.g., a $TiO_2$ layer, and emitter region 15 may be configured to provide a highly ohmic conduction path between the subcells 12, 14. In certain embodiments, this may be accomplished by fabricating the cell 10 such that a relatively conductive $TiO_2/p^+$-Si emitter interface is achieved between the titania layer 13 and the emitter region 15. Thus, with this structure, the top and bottom subcells 12, 14 are in direct contact with each other and lack a conventional interconnect layer, as found in known multi-junction cells. The multi-junction cell 10 may include any of the materials, structures, and additional layers disclosed herein and may be manufactured using any of the fabrication methods disclosed herein.

Figure 2:
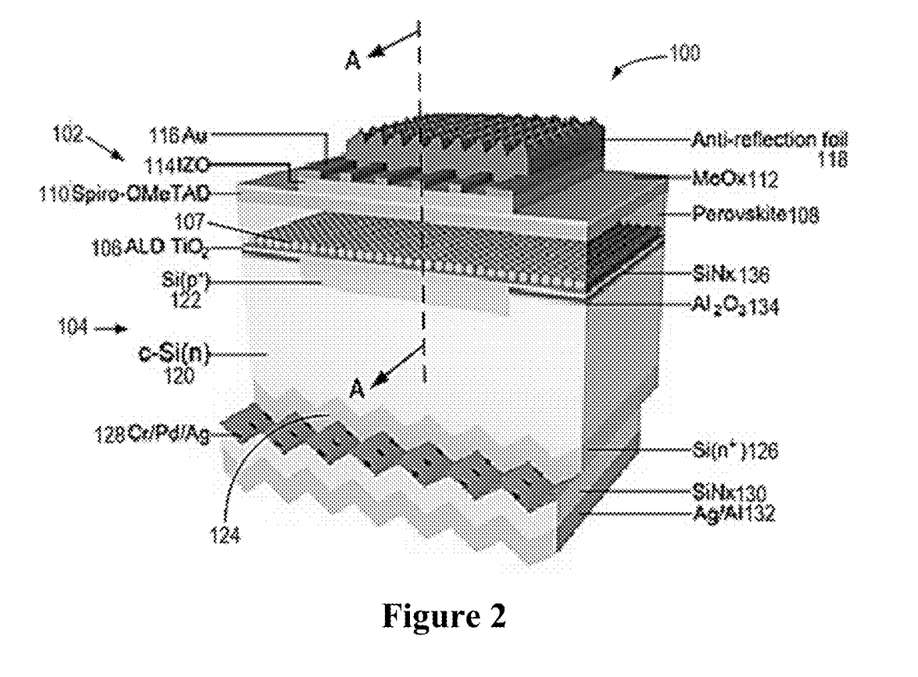
FIG. 2 is a schematic cross-sectional perspective view of an exemplary tandem photovoltaic cell.

FIG. 2 is a schematic cross-sectional perspective view of an exemplary, efficient, monolithic, two-terminal (2-T) perovskite/Si tandem solar cell 100 that was prepared.

The cell 100 does not utilize a conventional interconnection layer and instead places a perovskite top cell 102 in direct contact with the Si homojunction bottom cell 104. A highly ohmic contact may be formed between a $TiO_2$ layer 106 deposited by atomic-layer deposition (ALD) and a p$^+$-Si region 122. Despite the absence of an intentional recombination layer in the cell 100, under certain deposition conditions the conductive contact may be produced spontaneously between the two subcells 102, 104 in the monolithic tandem device 100. The conductive contact is consistent with the formation of an atomic-scale recombination layer due to a defective interphase region at the $TiO_2/p^+$-Si interface.

In the examples prepared, the contact resistance between the top and bottom cells 102, 104 was dependent on the band alignment at the $TiO_2/p^+$-Si interface and on the relative doping densities of the $TiO_2$ and Si, which were sensitive to the $TiO_2$ preparation method.

The perovskite top cell 102 may include any suitable perovskite material and conductive layers. In the example shown, the perovskite top cell 102 of the tandem device 100 includes an n-i-p structure with a stack comprising a cp-$TiO_2$ (compact $TiO_2$) layer (ALD-$TiO_2$) 106, a ms-$TiO_2$ (mesoporous-$TiO_2$) layer 107, a perovskite layer 108, a conductive polymer layer 110, for example, a layer of Spiro-OMeTAD (2,2',7,7'-Tetraakis-(N,N-di-4-methoxyphenylamino)-9,9'-spirobifluorene), or other known conductive polymer layers, a protective layer 112, such as a layer of metal oxide that includes, consists of, or consists essentially of oxygen and one or more elements, e.g., molybdenum (MoO$_x$ layer 112), a transparent conductor layer 114, such as a layer of indium zinc oxide (IZO), and a conductor layer 116, for example, a metal grid such as an Au grid or any other suitable metal such as Cu, Al, Ag or the like. An anti-reflection layer 118, such as an anti-reflection foil, may be applied over the top of the subcell 102, contacting the transparent conductor and conductor layers 114, 116, or other known techniques for light management of reflection losses in solar cells.

The ALD-$TiO_2$ layer 106 may be deposited so that it is uniform and conformal with a low surface roughness of about 0.77 nm. Whilst largely amorphous in its initially-deposited state, the compact $TiO_2$ layer 106 may be crystallized by annealing at 400° C. A compact $TiO_2$ layer 106 thickness of about 50 nm may be used, covered by an ms-$TiO_2$ layer 107 of thickness of about 70-80 nm, and an ultra-thin PCBM (Phenyl-C61-butyric acid methyl ester)/PMMA (Poly(methyl methacrylate)) passivation layer (not shown) to improve the cell voltage and reduce hysteresis in the current density vs. voltage (J-V) characteristics.

The perovskite layer 108 may include any suitable perovskite material. The $TiO_2$ hole tunnel layer may also be used with other top cell absorber materials included in the layer 108, as well. For example, multiple cation perovskites, which have consistently outperformed their single-cation originators, may be used in the cell 100. The perovskite layer 108 may fabricated using an anti-solvent one-step method. A composition of $Cs_{0.05}Rb_{0.05}FA_{0.765}MA_{0.135}PbI_{2.55}Br_{0.45}$ may be used for the layer 108, as it may yield stable films with an appropriate bandgap ($E_g$=1.63 eV).

Current matching between the two subcells 102, 104 may be obtained by deposition of a relatively thin (about 310 nm) perovskite layer 108. To reduce the parasitic absorption of the Spiro-OMeTAD hole blocking layer 110 while reducing pinholes, the perovskite layer 108 thickness may be reduced to about 120 nm.

Before sputtering the IZO layer 114 having a thickness of about 40 nm for the top contact, the protective MoO$_x$ layer 112 having a thickness of about 40 nm may be deposited to protect the Spiro-OMeTAD layer 110 from sputtering damage.

Optical losses on the top surface of the cell 100 may be reduced by the use of narrow metallic grids (e.g., Au grids) for the conductor layer 116, where the grids have a width of about 30 µm and a spacing of about 1 mm. This may result in grid loss of about 3%.

The bottom cell 104 includes a crystalline silicon (c-Si) substrate 120, which may be an n-type Si wafer with a passivated bottom surface 126 and bottom side texturing 124. The p$^+$-Si emitter region 122 may be formed in the C—Si substrate by doping, as described below. Conductor layers 128, 130 and 132 may be formed on the bottom of the c-SI substrate 102 forming the bottom terminal.

The bottom cell 104 may be a Si homojunction cell. An advantage of using a Si homojunction cell is a greater tolerance to high temperature processing, which may be used to achieve high-conductivity crystalline titania via annealing.

Figure 3:
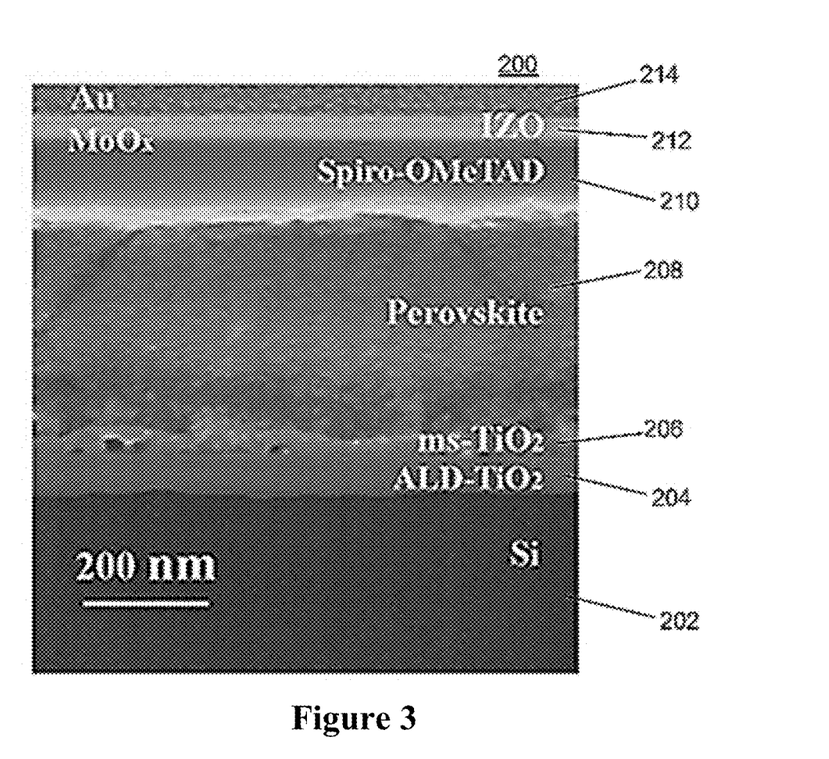
FIG. 3 is a cross-sectional scanning-electron microscope (SEM) image of an example of the tandem photovoltaic cell illustrated by FIG. 2 from the top surface to the $p^+$-Si layer.

FIG. 3 is a cross-sectional scanning-electron microscope (SEM) image 200 of an example of the tandem photovoltaic cell 100 illustrated by FIG. 2, from the top conductor surface 116 to the p$^+$-Si layer 122. The image 200 shows a Si emitter region 202, an ALD-TiO$_2$ layer 204, an ms-TiO$_2$ layer 206, a perovskite layer 208, a Spiro-OMeTAD layer 210, an MoO$_x$ layer, an IZO layer 212, and an Au conductor layer 214. The anti-reflection layer is not included in the image 200 due to its relatively large thickness of about 1 mm.

Figure 4:
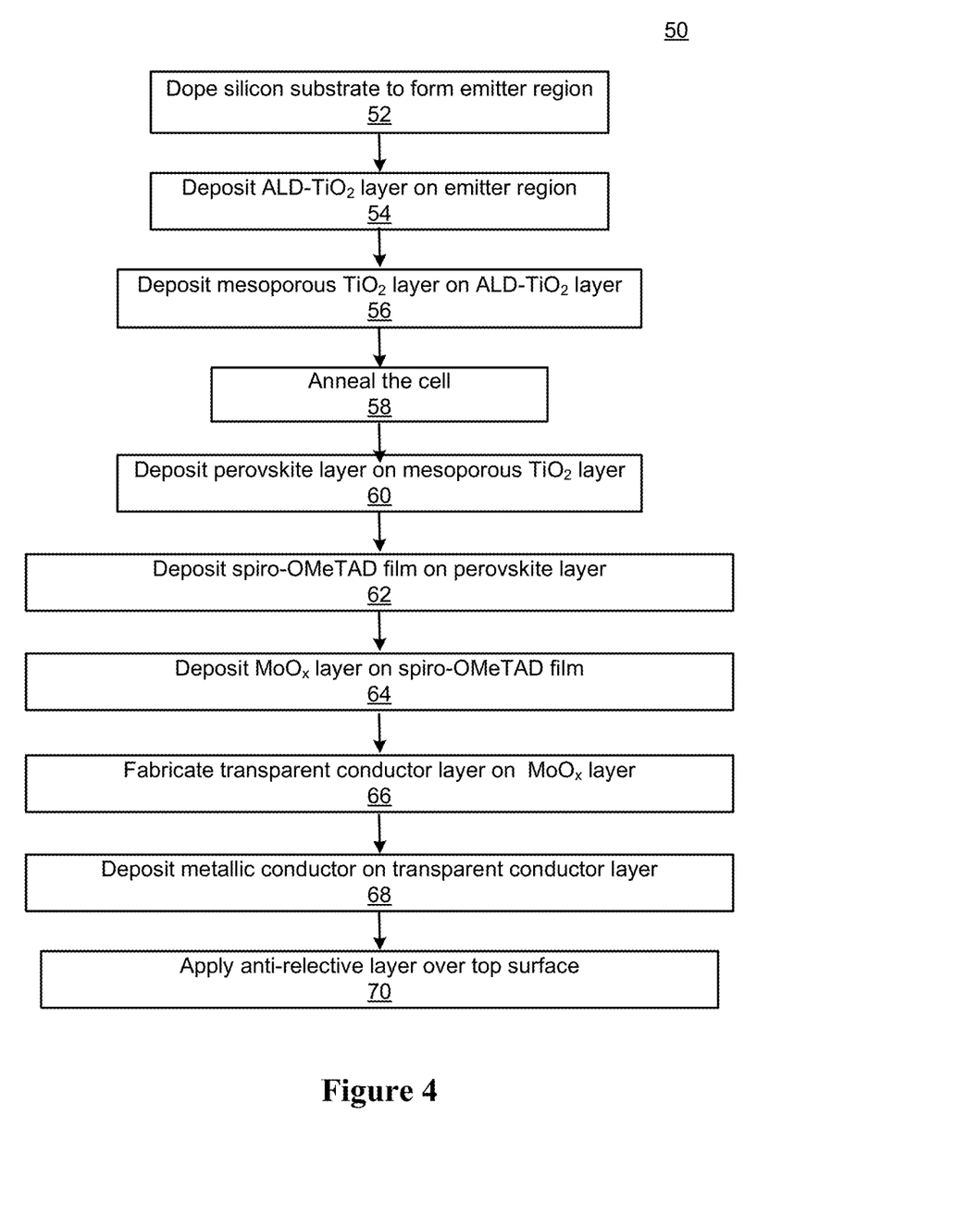
FIG. 4 is a flowchart diagram illustrating an exemplary method of making the tandem photovoltaic cell illustrated in FIG. 2.

FIG. 4 is a flowchart diagram 50 illustrating an exemplary method of making the tandem photovoltaic cell 100 illustrated in FIG. 2.

In step 52, the Si subcell is fabricated by forming the p-type emitter region on the c-Si substrate. This may be accomplished with the following steps. A 200 μm-thick n-type float zone (FZ) Si wafer with a resistivity of about 1 Ωcm may be used as the substrate. Both sides of the wafer may be chemically polished and coated with a thick SiO$_2$ layer via a 1050° C. dry oxidation process. The wafer may then immersed in 1% (volume percentage) hydrofluoric acid (HF) to remove the SiO$_x$ on the back side while the front side was protected with a coating of photoresist. A texturing process is then performed on the back side, which is then further covered with SiO$_x$ using a wet-oxidization process. The oxide on the front side of the wafer may then be removed and photolithography may be used to define the active region for boron-doping the p+ emitter region. Boron-diffusion may be performed by transferring the wafer into a Tempress furnace at 930° C. with deposition for 25 minutes and oxidation for 20 minutes. Next, phosphorus-diffusion doping (POCl$_3$) is performed on the rear-side with a back-to-back approach at a diffusion temperature of 780° C. for 30 minutes. The borosilicate glass on the front side and the phosphosilicate glass on the rear side are then removed using an HF etch. The textured rear side may then be passivated with SiN$_x$ (refractive index of about 1.9, 70 nm thick) deposited by plasma-enhanced chemical-vapor deposition (PECVD). The back side can utilize a point-contact scheme. Photolithography may be used to define the contact opening for the rear side of the wafer, followed by a reactive-ion etch (RIE). An HF etch may be then used to remove the passivation layers in the contact regions. A Cr/Pd/Ag metal stack may be thermally evaporated on the rear side of the wafer, and can then be lifted off with acetone in an ultrasonic bath. The Cr/Pd/Ag rear-contact stack is then covered with an Ag (100 nm)/Al (500 nm) contact capping layer using thermal-evaporation. On front side, the non-active area may be covered with about 20 nm Al$_2$O$_3$ deposited by ALD and about 100 nm SiN$_x$ deposited by PECVD.

In step 54, the compact TiO$_2$ or ALD-TiO$_2$ layer is prepared. The compact TiO$_2$ layer may be derived from one of three different precursors: tetrakisdimethylamidotitanium (TDMAT), titanium tetraisopropoxide (TTIP), or titanium tetrachloride (TiCl$_4$). The selected precursor may be deposited directly on top of p$^+$-Si emitter region of the Si wafer after removal of the Si native oxide from the wafer with an HF etch. Immediately after the HF etch, the Si solar cells are transferred to an ALD chamber for TiO$_2$ deposition.

For deposition using the TDMAT precursor, an Ultratech Fiji 200 Plasma ALD System may be used for the deposition, with the reaction temperature fixed at 150° C. The TDMAT precursor may be maintained at 75° C. Prior to ALD, a 0.10 s pulse of H$_2$O may be applied to the partially completed cell. Each ALD cycle may consist of a 0.015 s pulse of H$_2$O followed by a 0.10 s pulse of TDMAT. Between each precursor pulse, a 15 s purge under a constant 0.02 L min$^{-1}$ flow of research-grade N$_2$ (gas) may be used. While idle, the ALD system was maintained under a continuous N$_2$ (gas) purge and at a pressure of about 0.5 Torr.

A thermal ALD system may be employed for depositing TiO$_2$ films using the TTIP and TiCl$_4$ precursors, with N$_2$ (gas) as the purge gas. For the TiCl$_4$ precursor, the reactor temperature may be 75° C. and H$_2$O may be used as the oxidant. The chamber N$_2$ gas flow may be 200 ccm. Each ALD cycle can consist of a 0.75 s pulse of TiCl$_4$ followed by a 0.050 s pulse of H$_2$O. Between each precursor pulse, a 0.75 s purge under a constant 300 sccm flow of research-grade N$_2$ (gas) can be used. The deposition rate may be about 0.76 Å/cycle by spectroscopic ellipsometry.

For the TTIP precursor, the source may be heated to a temperature of 40° C., and the reactor set to a temperature of 230° C. H$_2$O may also be used as the oxidant. Each ALD cycle may consist of a 1 s pulse of TTIP followed by a 0.5 s pulse of H$_2$O. Between each precursor pulse, a 2 s purge under a constant 300 sccm flow of research-grade N$_2$ (gas) may be used. The deposition rate was determined to be about 0.023 Å/cycle.

To complete the tandem photovoltaic cell, an about 70-80 nm mesoporous TiO$_2$ layer may be deposited on the ALD-TiO$_2$ layer by spin-coating diluted TiO$_2$ paste (TiO$_2$:ethanol=1:12, weight %) at a speed of 5000 rpm (step 56).

The as-prepared mesoporous TiO$_2$ and ALD-TiO$_2$ layers undergo a high temperature annealing treatment at 400° C. for 20 min, which may be performed out in air (step 58). Immediately after cooling to room temperature from the annealing step, the cell substrate may be further passivated with an ultra-thin layer by spin-coating a poly(methyl methacrylate)/Phenyl-C61-butyric acid methyl ester (PMMA/PCBM) mixture (1:3, weight %) in chlorobenzene at 5000 rpm/s with a ramp of 5000 rpm/s for 30 s. The partially completed cell may then be subsequently baked on a hotplate at 100° C. for 10 min.

Next, the perovskite layer is deposited on the compact TiO$_2$ layer (step 60). A multiple cation perovskite precursor solution (Cs$_{0.05}$Rb$_{0.05}$FA$_{0.765}$MA$_{0.135}$PbI$_{2.55}$Br$_{0.45}$) may be used that contains 1.2 M PbI$_2$, 1.1 M FAI, 0.20 M PbBr$_2$, 0.20 M MABr, 0.091 M CsI, and 0.039 M RbI in 1 mL of anhydrous DMF:DMSO (8:2, volume ratio). Different spin-coating speeds and precursor solution concentrations may be used to select the desired perovskite film thickness.

A one-step process may be used to apply the perovskite layer. Alternatively, a two-step process may be used to apply the perovskite layer. For example, the multiple cation perovskite precursor solution may be deposited by spin-coating at 2000 rpm with a ramp rate of 200 rpm s$^{-1}$ for 10 s, and then again at 4000 rpm with a ramp of 1000 rpm s$^{-1}$ for 25 s. During the second step, about 100 μl chlorobenzene may be poured on the spinning substrates 5 s prior to the end of the spin cycle.

To reduce the perovskite thickness and ensure current matching, a 1 mL of the multiple cation perovskite precursor solution may be diluted with 0.2 mL anhydrous DMF:

DMSO (8:2, v/v) to obtain a 1.0 M concentration of $PbI_2$. In addition, the chlorobenzene dropping may be conducted earlier, about 8 s prior the end of the second spinning stage.

To further reduce the perovskite film thickness for the tandem device, the second stage of the spin-coating process may be modified additionally by increasing the ramp speed from 1000 rpm $s^{-1}$ to 4000 rpm $s^{-1}$, and changing the chlorobenzene dropping to about 10 s prior to the end of the program.

In all cases, the spin-coated perovskite films may be then annealed for 30 minutes at 100° C.

In step 62, a spiro-OMeTAD film is applied over the perovskite layer. To do this, a spiro-OMeTAD precursor solution may be prepared by dissolving 72.5 mg spiro-OMeTAD, 28.5 μL 4-tert-butylpyridine and 17.5 μL of lithium bis(trifluoromethanesulfonyl)imide solution (520 mg/mL in acetonitrile) in 1 mL of chlorobenzene. The spiro-OMeTAD thin film may then be deposited by spin-coating the precursor solution at 3500 rpm with a ramp of 3500 rpm $s^{-1}$ for 30 s. After spin-coating the Spiro-OMeTAD solution, the partially-completed cell substrate may be placed in a humidity-controlled box for 12 hours to allow the oxidation of the Spiro-OMeTAD film prior to electrode/contact layer deposition.

In step 64, an about 10 nm layer of $MoO_x$ is deposited on the cell over the Spiro-OMeTAD film by thermal evaporation at a rate of 0.05 nm/s under a high vacuum of $8 \times 10^{-7}$ Torr.

The transparent conductor is then fabricated by sputtering 40 nm of IZO on the $MoO_x$ (step 66). The sputtering may be performed for 60 min with 30 W of RF power under an Ar plasma, with a chamber pressure of 1.5 mTorr.

To complete the tandem solar cell, Au fingers with a period of 1 mm and width of 30 μm (3% shading) may be deposited on the cell using e-beam evaporation though a shadow mask (step 68). A textured anti-reflection foil may be applied on the top surface of the completed tandem device (step 70).

Figure 5A:
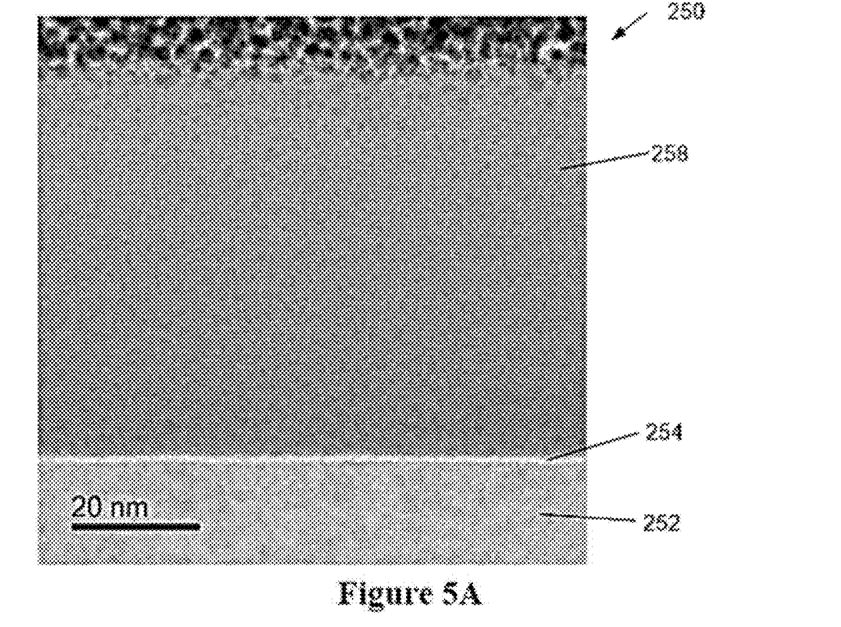
FIGS. 5A-B are transmission-electron microscopy (TEM) and high-resolution TEM (HRTEM) images, respectively, of the $TiO_2/p^+$-Si hetrojunction interface of an exemplary multi-junction photovoltaic cell.
Figure 5B:
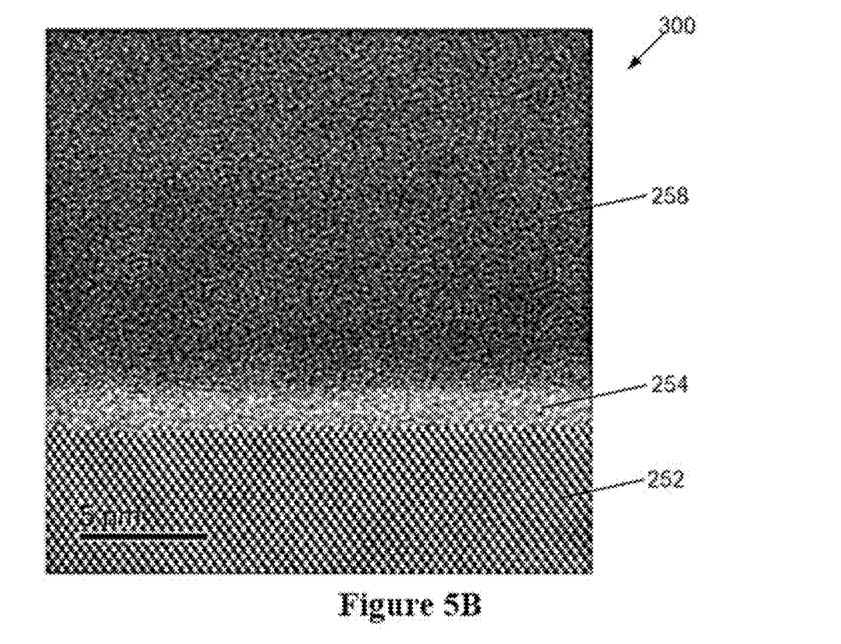

FIGS. 5A-B are transmission-electron microscopy (TEM) and high-resolution TEM (HRTEM) images, respectively, of the $TiO_2/p^+$-Si hetrojunction interface of an exemplary multi-junction photovoltaic cell.

FIGS. 5A-B are transmission-electron microscopy (TEM) and high-resolution TEM (HRTEM) images 250, 300, respectively, of the $TiO_2/p^+$-Si hetrojunction interface of an exemplary multi-junction photovoltaic cell. The TEM image 250 of FIG. 5A shows the $TiO_2$ layer 258 of the tandem cell, the $Si_xTi_xO_x$ layer 254 of $TiO_2/p^+$-Si hetrojunction interface, and the Si substrate 252. The HRTEM image 300 is a higher resolution image of the interface.

Figure 6:
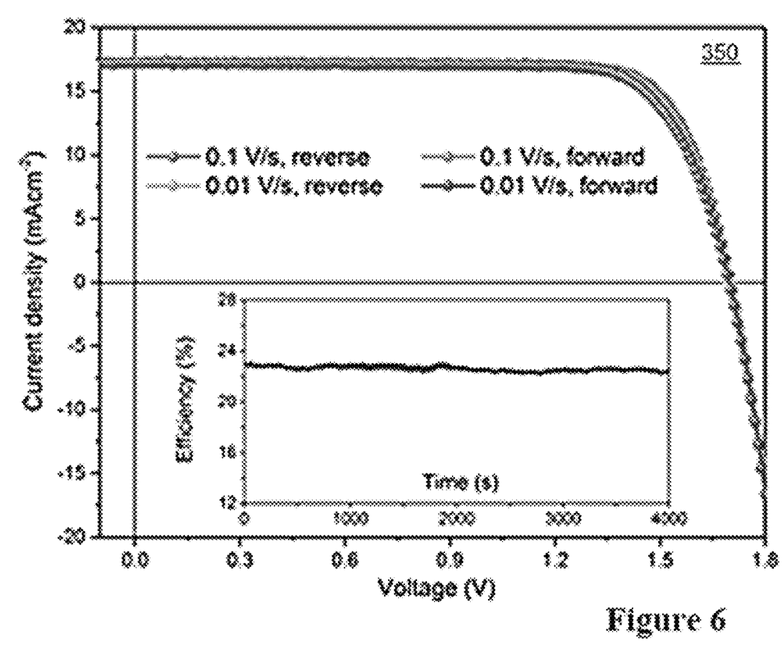
FIG. 6 is a graph of example experimental results showing the J-V behavior of an example tandem cell with both reverse and forward scanning at 0.1 V/s and 0.01 V/s, respectively.
Figure 13:
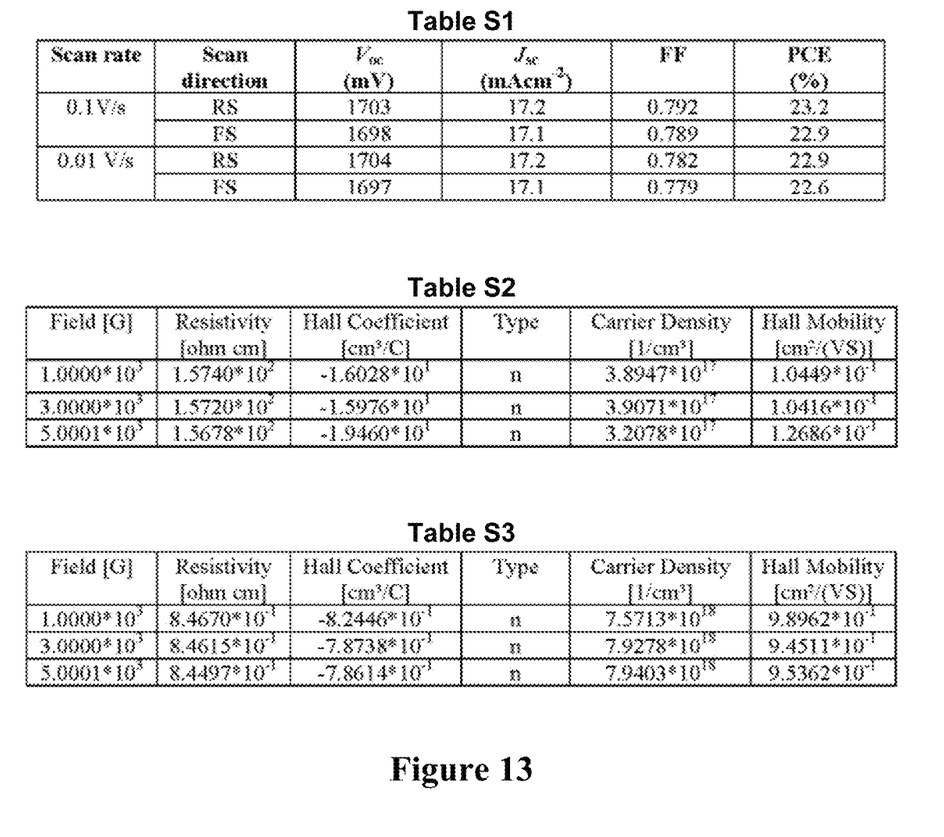
FIG. 13 shows tables summarizing experimental photovoltaic metrics of an example tandem photovoltaic cell and Hall-effect measurements regarding various states of the $TiO_2$-ALD layer of a tandem photovoltaic cell.

FIG. 6 shows a graph 350 of the photovoltaic J-V performance exhibited by tandem photovoltaic cells fabricated according to the methods described herein, with the corresponding photovoltaic metrics summarized in Table S1 of FIG. 13. The inset shows the efficiency evolution under continuous illumination for >1 h at the bias that yielded the maximum power point for the first J-V scan.

The J-V data were obtained at relatively slow scan rates (0.1V/s and 0.01V/s) in both the reverse and forward directions, and exhibited negligible hysteresis. The highest efficiency of 23.2% under 100 mW/$cm^2$ of simulated Air Mass 1.5G illumination was obtained with an open-circuit voltage ($V_{oc}$) of 1.703 V, a short-circuit current density ($J_{sc}$) of 17.2 mA $cm^{-2}$, and a fill factor (FF) of 0.792. The perovskite subcell alone exhibited a standalone efficiency of ~18.9%, and Si solar subcells fabricated including ALD-$TiO_2$ on a $p^+$-Si emitter, all other components being the same as those in our tandem design exhibited η=14.8%. An unencapsulated tandem cell example retained ~97% of its original efficiency (~22.5%) after 4000 s of continuous illumination in $N_2$ (gas) (FIG. 6, inset).

Due to the large number of material interfaces, optical losses must be reduced in an efficient multi-junction cell, such as those disclosed herein. The example tandem devices prepared as described herein had a low average reflection over the 400-1200 nm spectral region, partly due to the attachment of a textured foil to the front surface (see graph 400 of FIG. 7). The graph 400 shows absorbance (1−R, where R is the reflectance) of an example tandem photovoltaic device (dashed-dot line), external quantum efficiency (EQE) of the perovskite top subcell (left-side line), and EQE of the c-Si bottom subcell (right-side line).

Figure 7:
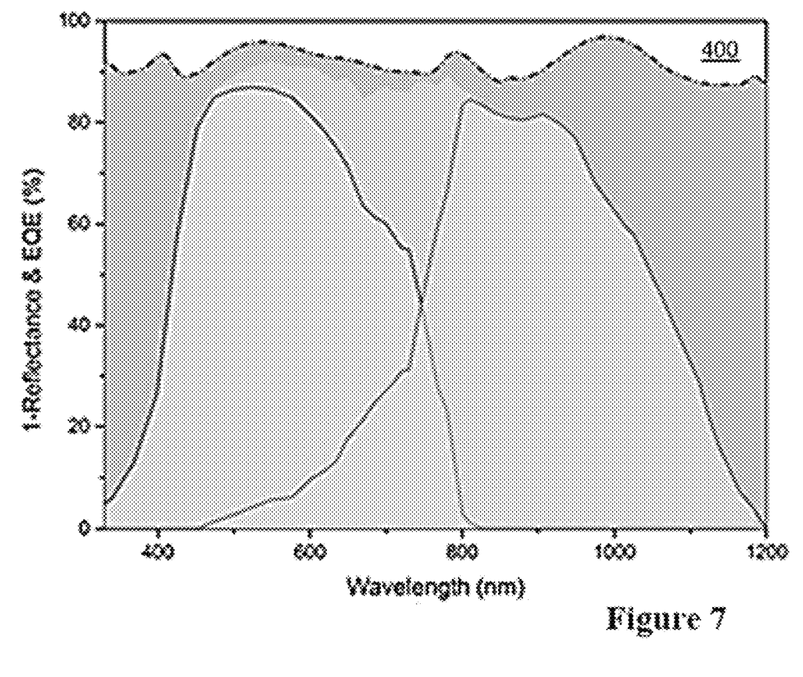
FIG. 7 is a graph of example experimental results showing the light absorbance of an example tandem cell having a $TiO_2/p^+$-Si hetrojunction interface.

Spectral response analysis revealed that the fabricated tandem cells yielded excellent current matching between subcells, with only a slightly larger integrated current density of ~17.5 mA/$cm^2$ for the perovskite top subcell as compared with a current density of ~17.2 mA/$cm^2$ for the Si bottom subcell. Better light management, via tuning of the perovskite composition and removal of optical absorption and reflection from the Spiro-OMeTAD contact, may allow for higher short-circuit current densities.

Minority-carrier lifetime measurements of example cells indicated that the $TiO_2$ only provided a weak passivation effect on the $p^+$-Si emitter, hence increased passivation of the $p^+$-Si surface may further improve the open-circuit voltage of the tandem cell. Strategies including enhancement of the p+-doping density to reduce the emitter thickness and hence absorption, or optimizing the $p^+$-Si and $TiO_2$ interface with respect to passivation, may also be beneficial.

Efficient operation of the tandem photovoltaic cells disclosed herein requires efficient charge transfer between the $p^+$-Si emitter and $TiO_2$ layer. Specifically, photogenerated electrons collected in the $TiO_2$ layer should be able to recombine, while incurring little voltage loss, with corresponding holes from the Si emitter region. The n-type character of $TiO_2$ layer would be expected to produce a rectifying p-n heterojunction with p-type Si emitter region. However, the J-V characteristics of the disclosed tandem photovoltaic devices did not exhibit S-shaped curves, nor fill-factor losses, that would be expected if a rectifying contact were present between the two subcells. The existence of facile electrical contact between $TiO_2$ layer and $p^+$-Si emitter was experimentally confirmed in prepared tandem cells. The contact resistivity (pc) of both films with respect to $p^+$-Si was determined via the method devised by Cox and Strack. The contact resistivity so derived includes not only the desired metal oxide/$p^+$-Si contact resistivity, but also includes contributions from the bulk oxide as well as the oxide/Al contact. These experimental measurements confirmed that the contact between $TiO_2$ and $p^+$-Si was highly ohmic, characterized by a resistivity less than 30 mΩ$cm^2$, surpassing that of an ITO/$p^+$-Si combination (~230 mΩ$cm^2$).

Annealing the $TiO_2$ layers played helped to achieve the desired low resistance contact between subcells. Indeed, superior performance for the $TiO_2/p^+$-Si interface was obtained after annealing the structure at 400° C. in ambient air, which produced more than a ten-fold reduction in the derived contact resistance (compare Tables S2 and S3 of FIG. 13). The interconnect-free tandem cells described herein thus have dual advantages of higher performance as well as more facile fabrication.

Figure 8:
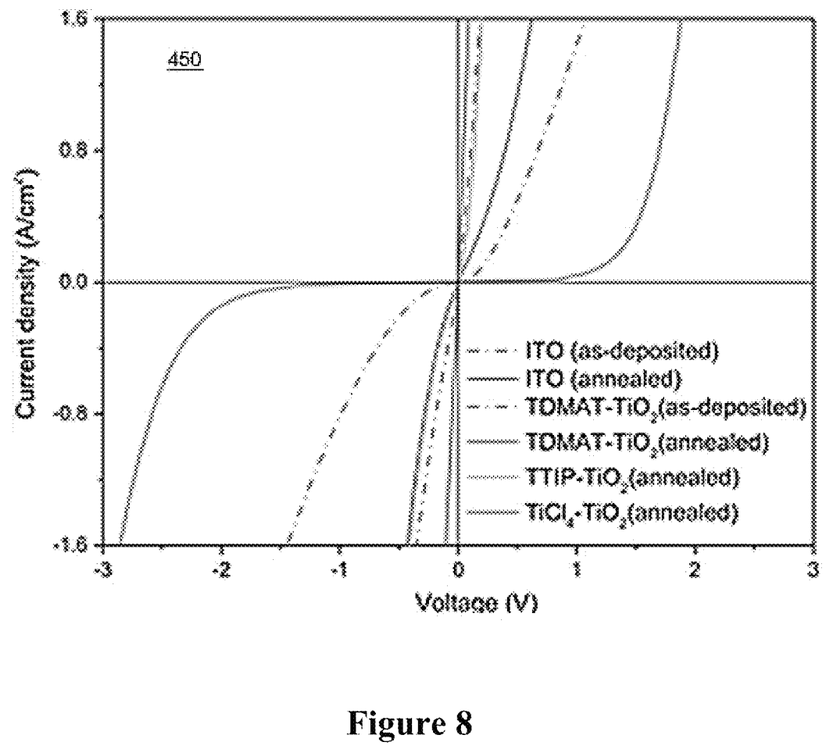
FIG. 8 is a graph of example experimental results comparing the J-V behavior of various $TiO_2/p^+$-Si interface structures of tandem cells before and after annealing at 400° C. in air.

The $TiO_2$ layer 106 may be prepared using different ALD precursors, which each exhibited mutually different J-V characteristics (see graph 450 of FIG. 8). Ohmic, highly conductive behavior was observed after annealing the TiO$_2$ using tetrakisdimethylamidotitanium (TDMAT) as the ALD precursor (FIG. 8, green solid line); however, very low conductivity (>10 Ωcm$^2$) in the low-bias region was obtained when titanium tetrachloride (TiCl$_4$) was used as the ALD precursor instead of TDMAT, despite nominally identical processing conditions (FIG. 8, blue solid line). The use of titanium tetraisopropoxide (TTIP) as the ALD precursor resulted in intermediate performance, displaying conductive but distinctly non-linear J-V behavior (FIG. 8, yellow solid line). The conductivity of the TiO$_2$/p$^+$-Si test structures shown in FIG. 8 correlated well with the behavior of the example prepared tandem devices, with η=21% for a tandem cell fabricated with TTIP as the precursor and η=3.6% for a tandem cell fabricated with TiCl$_4$ as the precursor.

Figure 9:
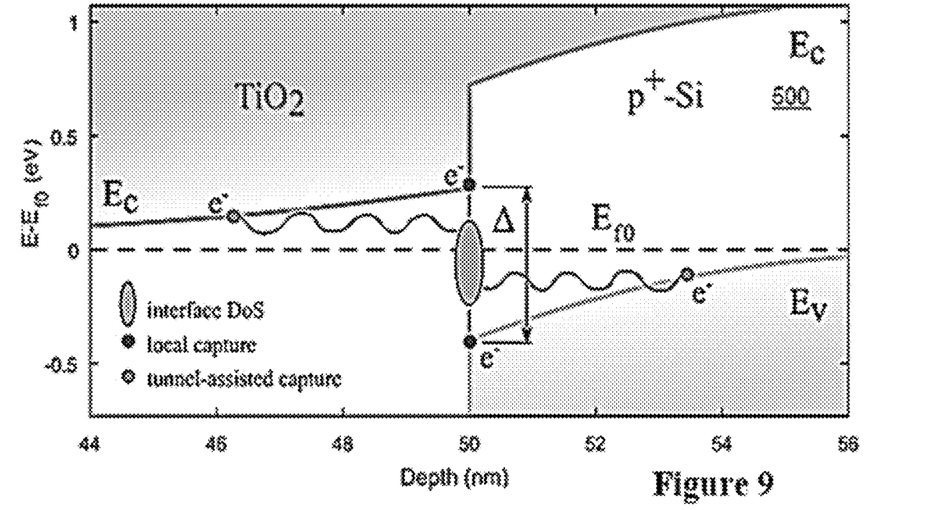
FIG. 9 is an example simulated band diagram of the $TiO_2/p^+$-Si interface of an exemplary tandem cell at equilibrium.

The interfacial band alignment facilitates carrier transport between TiO$_2$ and p$^+$-Si. Based on X-ray photoelectron spectroscopic (XPS) measurements of the electron affinity ($\chi^{TiO_2}$) for our TiO$_2$ samples (4.35-4.7 eV) and the ionization energy of Si (I.E.$^{Si}$), taken as 5.15 eV, neglecting any surface dipole contribution the band alignment at an idealized TiO$_2$/p$^+$-Si junction should result in an energy gap of $\Delta = E_c^{TiO_2} - E_v^{Si} = \chi^{TiO_2} - I.E.^{Si} \approx 0.45$-$0.8$ eV, between the top of the Si valence band and the bottom of the TiO$_2$ conduction band (FIG. 9). FIG. 9 is an example simulated band diagram 500 of the TiO$_2$/p$^+$-Si interface of an exemplary tandem cell at equilibrium.

Experimental determinations of Δ that include the surface dipole require combining data from several techniques, and have only been reported rarely for TiO$_2$/p-Si interfaces. Values of Δ between 0.45 eV and 0.8 eV have been obtained depending on the 1-2 nm interlayer composition, supporting the observation of a sensitivity to processing. A non-vanishing gap at the TiO$_2$/p$^+$-Si interface prohibits at 0 V band-to-band tunneling between the TiO$_2$ conduction band and the Si valence band, due to a lack of overlap in the bulk density of states at equilibrium (see FIG. 9), as would occur in a tunnel diode. Sub-gap states in TiO$_2$ due to a band-tail or defect band may alter this situation, but the mechanism is essentially the same as a defect-mediated pathway. The necessary band overlap between the TiO$_2$ conduction band and the Si valence band occurs at a threshold reverse voltage, but carriers must nevertheless tunnel through the sum of the depletion and interlayer widths, estimated to be 10's of nanometers for TiO$_2$ doping in the range of 10$^{17}$-10$^{19}$ cm$^{-3}$. This distance is at the upper limit of what is physically reasonable, and indicates that band-to-band tunneling at reverse bias is only likely to occur when both depletion regions are very small, corresponding to high doping. At forward bias, the band overlap is decreased and band-to-band tunneling becomes prohibited. In this case, current could be carried via the thermionic emission of conduction-band electrons from TiO$_2$ over the barrier due to the conduction-band offset, $E_g^{Si} - \Delta$, to Si, but this mechanism would predict a strong tradeoff between the forward and reverse current, contrary to the observed ohmic behavior (i.e., large gaps Δ would provide a small barrier for the forward current while enlarging the threshold voltage for reverse current, and vice versa).

These considerations indicate that the presence of a pristine interfacial energy gap Δ is not readily compatible with the observed highly conductive contact between the TiO$_2$ and p$^+$-Si layers. A more likely alternative is the presence of a substantial density of localized mid-gap states at the interface between Si and TiO$_2$. Such interfacial states can facilitate band-to-band tunneling at reverse bias and act as generation-recombination centers at all bias voltages. In such a scenario, electrons can move into and out of the defects states via local capture/emission as well as tunneling (FIG. 9). As generation-recombination centers, the interface states would have a substantial influence on charge transport by facilitating recombination of carriers at forward bias without requiring carriers to cross over the interfacial barrier. At reverse-bias, every recombination center could become a source of generation, and high conductivity may be obtained by thermally generated carriers. Conceptually, this situation is similar to having a recombination-layer of atomic dimensions between the TiO$_2$ and p$^+$-Si created in situ and intrinsically via the native material contact, without the introduction of substantial optical losses.

Numerical drift-diffusion models based on SCAPS simulation software were used to investigate the impact of interfacial generation-recombination centers on the junction current. These models were designed to compute the current across a TiO$_2$/p$^+$-Si heterojunction assuming ohmic metal contacts on both sides, and therefore mainly addressed the junction current, with only minor contributions from bulk conduction through the small layers thicknesses (50 nm and 100 nm for TiO$_2$ and Si, respectively). Shockley-Read-Hall (SRH) recombination centers were added at the simulated TiO$_2$/p$^+$-Si interface to physically correspond to localized states that are expected to form in the interfacial energy gap. Such defects are likely to occur at a high density, given the relatively low degree of lattice matching between TiO$_2$ and c-Si, the possibility of precursor remnants, Si dangling bonds, and the presence of a 1-2 nm amorphous alloy interlayer 254 observed in our samples between the two bulk crystals (FIGS. 5A-B). Interlayers are known to have a profound effect on the interface dipole or band-alignment of semiconductor-semiconductor contacts, as well as on the mechanisms of charge transfer, and may therefore play a key role in the experimental tandem cells. For simplicity in the modeling, the contribution of the interlayer capacitance was neglected, while the defect density of the interlayer was captured in the interfacial SRH parameters. Tunneling due to defects was not accurately modeled due to a lack of detailed knowledge of the interface parameters, but calculations with tunneling processes included are presented in FIG. 10 to illustrate qualitatively the behavior that results from this effect.

Figure 10:
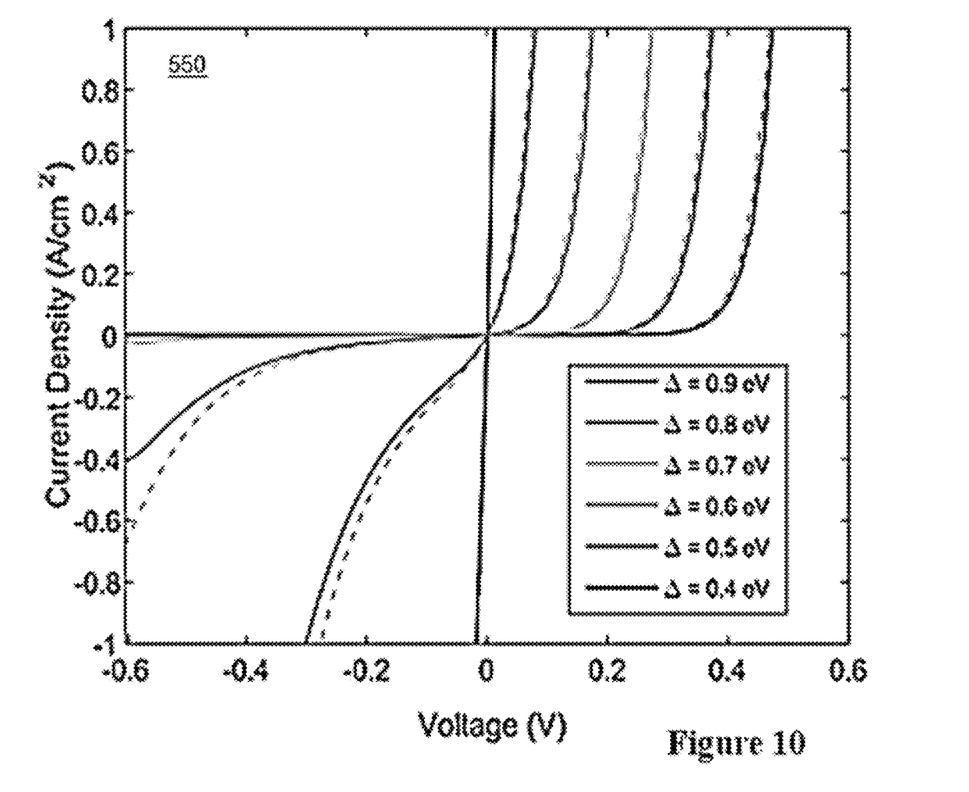
FIG. 10 is a graph of example simulated I-V curves for varying interfacial gaps Δ of various $TiO_2/p^+$-Si hetrojunctions usable in examples of the tandem cell.

FIG. 10 is a graph 550 showing example simulated J-V characteristics of TiO$_2$/p$^+$-Si heterojunctions with varying gaps Δ in the range of 0.4-0.9 eV, and with a high density of neutral mid-gap defects (recombination velocities $S_n = S_p = 10^5$ cm/s), and all other parameters being equal. The various TiO$_2$/p$^+$-Si hetrojunctions are usable in examples of the tandem cell. A single neutral mid-gap SRH defect was included in the simulation with $S_n = S_p = 10^5$ cm/s. The dashed curves are computed with tunneling to defects included in the modeling.

These characteristics were computed using the SCAPS application software. The J-V characteristics of graph 550 bear a striking resemblance to the experimental behavior of the TiO$_2$/p$^+$-Si heterojunctions the disclosed tandem cells (shown in FIG. 8) in that they both exhibit the full range of qualitative characteristics seen experimentally, namely highly conductive ohmic behavior (e.g. Δ=0.4), asymmetric exponential-type curves (Δ=0.5, 0.6 eV) and strong rectification (Δ=0.7-0.9 eV). The detrimental effect of a large band offset can only be compensated by higher recombination velocities up to the physical limit of $S_{n,p} = v_{th} \approx 10^7$ cm/s, likely ruling out high defect-mediated conductivity for band offsets greater than ~0.7 eV. A somewhat less trivial prediction of the SRH model concerns the balance of carrier densities at the interface. The interfacial carrier densities should be balanced to achieve maximal conductivity (in particular $v_n n_0 \approx v_p p_0$ where $n_0, p_0$ are the equilibrium carrier densities at the interface and $v_{n,p}$ their quasi-recombination velocities).

Figure 11:
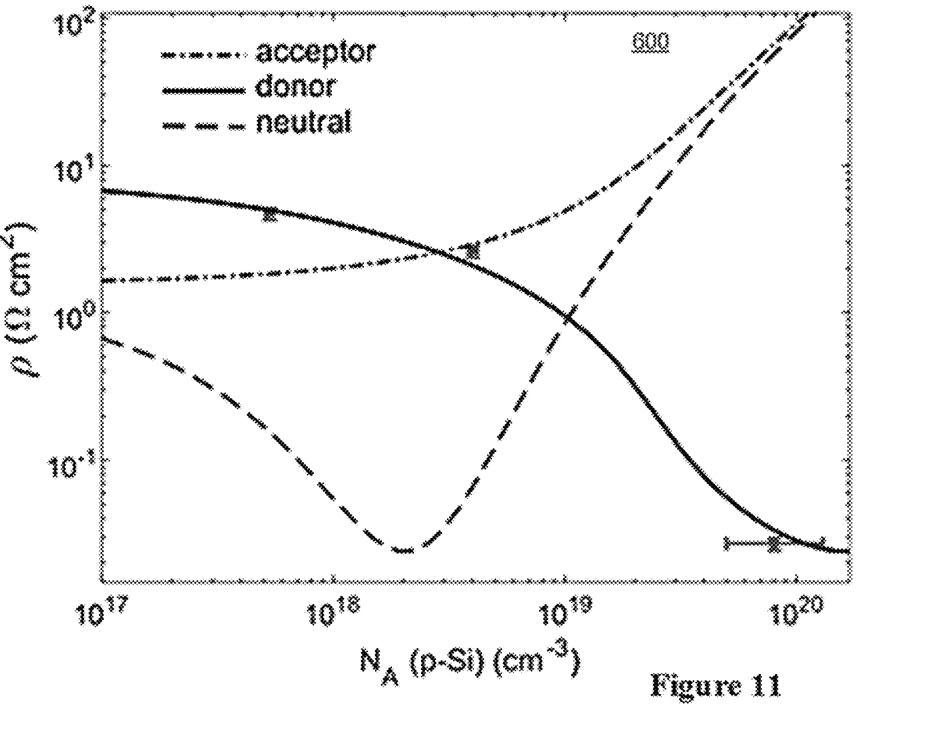
FIG. 11 is a graph of example simulated small voltage resistivity of a $TiO_2/p^+$-Si hetrojunction at various p-Si acceptor doping levels.

The interfacial conductivity of the prepared $TiO_2/p^+$-Si heterojunctions benefitted from a high substrate doping (graph 600 of FIG. 11, square dots), which is consistent with donor type defects at the interface that act to deplete the hole density. Donor defects are frequently present at both $TiO_2$ and unpassivated-Si surfaces in the form of oxygen vacancies and dangling bonds ($P_b$ centers), respectively. The SRH theory thus consistently accounts for the ohmic conductivity between $TiO_2/p^+$-Si. The graph 600 shows an example simulated small voltage resistivity of a $TiO_2/p^+$-Si heterojunction at various p-Si acceptor doping levels. Simulated small voltage resistivity $$\left(\rho = \frac{dV}{dI}\bigg|_{V=0}\right)$$

with the $TiO_2$ donor density fixed at $10^{18}$ cm$^{-3}$ and variable p-Si acceptor doping. Measurements are shown as the square data points and range. Calculations for neutral (solid lines), acceptor-type (dotted lines) and donor-type (dot-dashed lines) are shown to demonstrate the important effect of defect charge on the interfacial carrier balance.

Figure 12:
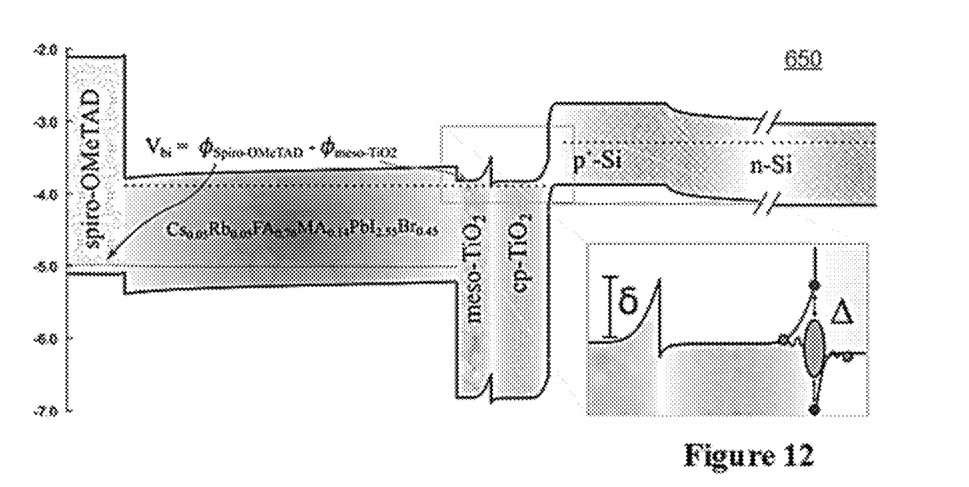
FIG. 12 is an example simulated band diagram of an exemplary tandem cell at illuminated open-circuit.

According to the SRH theory outlined above, the diverse interface behavior seen in the graph 450 of FIG. 8 with respect to preparation conditions likely results from variations in the band offsets between the $TiO_2$ conduction-band edge and the Si valence band ($\Delta$), the $TiO_2$ doping density, and the interfacial defect properties. The experimental data suggest that a small $\Delta$, in addition to a conductive $TiO_2$ layer, may be helpful to obtain a high-conductivity contact between $p^+$-Si and TDMAT-ALD $TiO_2$. The built-in voltage of a perovskite cell is determined in part by the work function of the n-type $TiO_2$ selective contacts (corrected for surface dipole contributions), and thus has an effect on the maximum open-circuit voltage. Larger n-type selective contact work functions reduce the built-in voltage and therefore the achievable quasi-Fermi level splitting, in contrast to the experimental observations that the perovskite cells on TDMAT $TiO_2$ function without substantial losses. The observed cell performance is thus indicative of an additional role for the mesoporous $TiO_2$ layer that is inserted in the cell architecture between the compact $TiO_2$ layer and the perovskite—to improve film quality and electron extraction. Experimental measurements indicated that the conduction band in compact TDMAT-ALD $TiO_2$ is energetically lower-lying than in other $TiO_2$ preparations. Due to its smaller work function, inclusion of the solution-processed mesoporous $TiO_2$ layer therefore appears to maintain the built-in voltage of the cell. An example simulated band diagram 650 (FIG. 12) of the complete tandem photovoltaic cell structure of FIG. 2 summarizes the key findings that contact between the high-work function cp-$TiO_2$ layer and $p^+$-Si is facilitated by interface defects, and that high cell voltages for the complete tandem cell 100 rely on the inclusion of the lower work function mesoporous $TiO_2$ to maintain the built-in voltage of the perovskite subcell. FIG. 12 shows the example simulated band diagram 650 of the cell 100 at illuminated open-circuit. The inset depicts the two critical energetic offsets $\Delta$ and $\delta$, respectively, defined as the valence-to-conduction band offset at the $TiO^2$—Si interface and the difference in work functions between the solution-processed mesoporous $TiO^2$ layer and that of the ALD compact $TiO^2$ layer.

FIG. 13 shows tables S1, S2, S3 summarizing experimental photovoltaic metrics of an example tandem photovoltaic cell and Hall-effect measurements regarding various states of the $TiO_2$ layer of a tandem photovoltaic cell.

Disclosed herein are examples of two-terminal perovskite-Si tandem photovoltaic devices that function without a conventional interlayer between their sub-cells. An enabling feature of the devices is the formation of an atomic-scale recombination layer between a compact TDMAT-ALD $TiO_2$ layer and the pt-Si emitter region, which produces a highly conductive, relatively ohmic contact between the two materials. The contact resistance, interfacial band offsets, defect densities, and doping densities are dependent on processing, but therefore present several handles for tunability. The twin advantages of the disclosed cells in reducing optical losses and in reducing processing steps brings the perovskite-Si pairing tandem structure closer to delivering its full potential.

Under experimental conditions, the prepared tandem cells yielded efficiencies as high as about 23.2% under 100 mW/cm$^2$ of Air Mass 1.5G simulated sunlight, with an open-circuit voltage of 1.703 V, a short-circuit current density of about 17.2 mA/cm$^2$, and a fill factor of 0.792.

Although the foregoing description discloses exemplary tandem cells, it should be understood that the cells and structures disclosed herein may be used in multi-junction cells having more than two subcells, for example, three, four or more subcells fabricated into a single photovoltaic cell.

The disclosed cells may also be electrically connected together, for example, in series or parallel, to form a module comprising a plurality of cells, such as a solar module or panel.

The foregoing description is illustrative and not restrictive. Although certain exemplary embodiments have been described, other embodiments, combinations and modifications involving the invention will occur readily to those of ordinary skill in the art in view of the foregoing teachings. Therefore, this invention is to be limited only by the following claims, which cover at least some of the disclosed embodiments, as well as all other such embodiments and modifications when viewed in conjunction with the above specification and accompanying drawings.

What is claimed is:

1. A multi-junction photovoltaic cell, comprising:
   a first light absorption layer comprising perovskite;
   a second light absorption layer; and
   a wide bandgap oxide conductor comprising
      a compact titanium dioxide layer (cp-$TiO_2$);
      a mesoporous titanium dioxide layer contacting the compact titanium dioxide layer;
   wherein the first light absorption layer contacts the mesoporous titanium dioxide layer;
   wherein the second light absorption layer contacts the cp-$TiO_2$ layer; and
   wherein a band alignment between the cp-$TiO_2$ and the second light absorber comprises an ohmic contact with a resistivity less than 30 mΩcm$^2$; and
   wherein the cp-$TiO_2$ layer is formed by atomic layer deposition (ALD) with tetrakisdimethylamidotitanium (TDMAT) and annealed at about 400° C.

2. The multi-junction photovoltaic cell of claim 1, wherein the second light absorption layer includes a silicon substrate that includes a p-type doped emitter region.

3. The multi-junction photovoltaic cell of claim 1, wherein the second light absorption layer includes n-type silicon.

4. The multi-junction photovoltaic cell of claim 1, wherein a second light absorption layer is a homojunction cell.

5. The multi-junction photovoltaic cell of claim 1, wherein:
- a Spiro-OMeTAD layer contacting the first light absorption layer;
- an $MoO_x$ layer contacting the Spiro-OMeTAD layer;
- a transparent conductor layer contacting the $MoO_x$ layer; and
- a conductor layer contacting the transparent conductor layer.

6. The multi-junction photovoltaic cell of claim 5, wherein the conductor layer includes a metal grid.

7. A two-terminal tandem photovoltaic cell, comprising:
- a first subcell including a first light absorption layer of perovskite material;
- a second subcell including a second light absorption layer of a semiconductor; and
- a large bandgap oxide conductor layer contacting the perovskite material and the semiconductor, wherein the large bandgap oxide conductor layer provides an ohmic contact with a resistivity less than 30 $m\Omega cm^2$; and wherein the large bandgap oxide conductor layer is formed by atomic layer deposition (ALD) with tetrakisdimethylamidotitanium (TDMAT) and annealed at about 400° C.

8. The two-terminal tandem photovoltaic cell of claim 7, wherein the second subcell is a crystalline silicon homojunction subcell.

9. The two-terminal tandem photovoltaic cell of claim 7, wherein the oxide conductor layer includes:
- a compact titanium dioxide layer contacting a crystalline p-type emitter; and
- a mesoporous titanium dioxide layer contacting the compact titanium dioxide layer; and wherein the first subcell includes:
- a perovskite layer contacting the mesoporous titanium dioxide layer;
- a Spiro-OMeTAD layer contacting the perovskite layer;
- an $MoO_x$ layer contacting the Spiro-OMeTAD layer;
- an IZO layer contacting the $MoO_x$ layer; and
- a conductor layer contacting the IZO layer.

10. The two-terminal tandem photovoltaic cell of claim 9, further comprising an anti-reflective layer formed over the IZO layer and conductor layer.

* * * * *